US008969925B2

(12) United States Patent
Eklund et al.

(10) Patent No.: US 8,969,925 B2

(45) Date of Patent: Mar. 3, 2015

(54) SEMICONDUCTOR ELEMENT

(75) Inventors: Klas-Hakan Eklund, Sollentuna (SE); Lars Vestling, Uppsala (SE)

(73) Assignee: K.Eklund Innovation, Uppsala (SE)

( * ) Notice: Subject to any disclaimer, the term of this patent is extended or adjusted under 35 U.S.C. 154(b) by 0 days.

(21) Appl. No.: 14/003,530

(22) PCT Filed: Mar. 1, 2012

(86) PCT No.: PCT/SE2012/050234
§ 371 (c)(1),
(2), (4) Date: Sep. 6, 2013

(87) PCT Pub. No.: WO2012/121650
PCT Pub. Date: Sep. 13, 2012

(65) Prior Publication Data

US 2014/0001517 A1 Jan. 2, 2014

(30) Foreign Application Priority Data

Mar. 8, 2011 (SE) ...................................... 1150203

(51) Int. Cl.

| | |
|---|---|
| ***H01L 29/66*** | (2006.01) |
| ***H01L 27/06*** | (2006.01) |
| ***H01L 29/78*** | (2006.01) |
| ***H01L 29/06*** | (2006.01) |

(52) U.S. Cl.
CPC ........ *H01L 27/0617* (2013.01); *H01L 29/7835* (2013.01); *H01L 29/0634* (2013.01)
USPC .... 257/262; 257/263; 257/264; 257/E29.066; 257/E21.403

(58) Field of Classification Search
None
See application file for complete search history.

(56) References Cited

U.S. PATENT DOCUMENTS

| | | | |
|---|---|---|---|
| 5,146,298 A | 9/1992 | Eklund | |
| 6,613,622 B1 | 9/2003 | Nair et al. | |
| 7,064,407 B1 | 6/2006 | Mallikarjunaswamy | |
| 7,915,704 B2 * | 3/2011 | Lin et al. | 257/476 |
| 8,168,466 B2 * | 5/2012 | Quddus et al. | 438/92 |
| 2002/0050613 A1 | 5/2002 | Rumennik et al. | |
| 2008/0197445 A1 | 8/2008 | Disney et al. | |
| 2011/0127602 A1 * | 6/2011 | Mallikarjunaswamy | 257/331 |

OTHER PUBLICATIONS

International Search Report, dated May 22, 2012, from corresponding PCT application.

Extended European Search Report, dated Jun. 27, 2014, from corresponding EP application.

* cited by examiner

*Primary Examiner* — Yasser A Abdelaziez
(74) *Attorney, Agent, or Firm* — Young & Thompson

(57) ABSTRACT

A semiconductor device includes a substrate, a body region adjoining the substrate surface, a source contact region within the body region, a drain contact region adjoining the substrate surface and being separated from the body region, a dual JFET gate region located between the body region and the drain contact region, and a lateral JFET channel region adjoining the surface of the substrate and located between the body and the drain contact regions. A vertical JFET gate region is arranged essentially enclosed by the body region, a vertical JFET channel region being arranged between the enclosed vertical JFET gate and the dual JFET gate regions, a reduced drain resistance region being arranged between the dual JFET gate and the drain contact regions, and a buried pocket located under part of the body region, under the dual JFET gate region and under the vertical JFET channel and reduced drain resistance regions.

8 Claims, 2 Drawing Sheets

SEMICONDUCTOR ELEMENT

The present invention relates to a semiconductor device, especially a semiconductor device for use in RF-LDMOS devices for integration into standard CMOS technologies so as to enable a cost-effective on-chip design of multi-band PAs for single-chip solutions, e.g. WLAN applications.

The strong trend toward integration in hand held communication devices for cost and size advantages has started an intensive research effort on the implementation of high power and high efficiency power amplifiers in modern CMOS technologies. The main workhorse up to date has been using the bipolar device in 0.13 μm BiCMOS technologies. Advanced standard CMOS technologies at the 65 nm/45 nm node, otherwise suitable for single chip solutions e.g. WLAN, lack high voltage (around 10V) devices with good linearity and efficiency required for on-chip power amplifiers in the frequency range 2-5 GHz.

In U.S. Pat. No. 5,146,298 a high voltage LDMOS device is implemented as a low voltage MOS device in series with 2 JFETs with common source and drain. This type of device works well as long as the extended drift region is longer than a couple of pm and with a breakthrough voltage in the region of 30-800V. [R. Y. Su, F. J. Yang, J. L. Tsay, C. C. Cheng, R. S. Liou and H. C. Tuan, "State-of-the-art Device in High Voltage Power IC with Lowest On-State Resistance", IEEE International Electron Devices Meeting (IEDM), pp. 492-495, 2010.]

Figure 1:
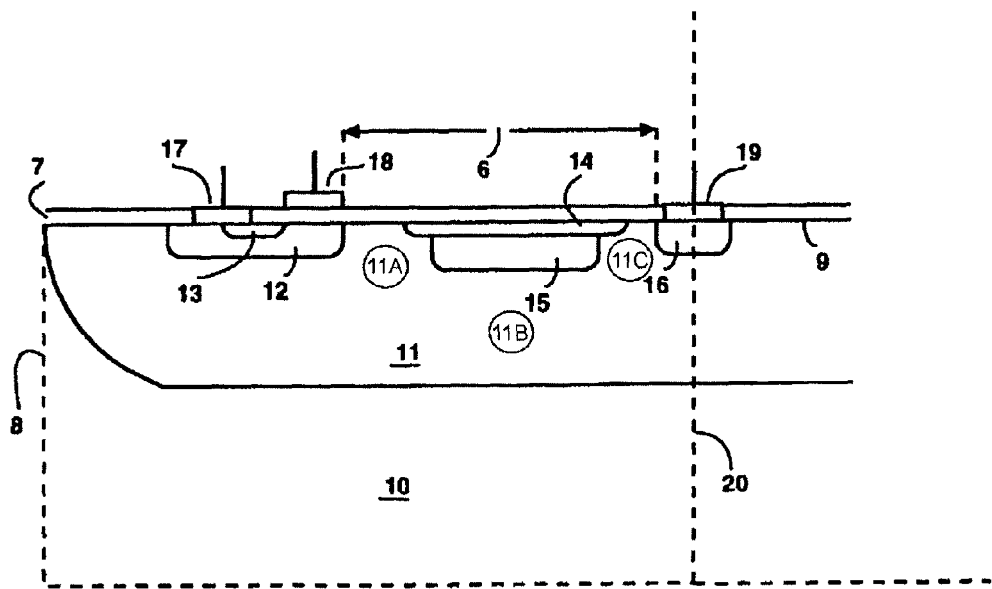

In FIG. 1, which is FIG. 1 from U.S. Pat. No. 5,146,298, is shown the above mentioned low voltage MOS device in series with 2 JFETs with common source and drain, and where now region 11 has been divided into regions 11A, 11B and 11C. The region marked 11A is part of pocket 11, close to the source region 13. 11B is part of the pocket 11 under region 15, and 11C is part of the pocket 11 close to the drain contact region 16. For a BV of around 10V where the distance 6 between gate and drain is around 0.5 μm the on-resistance and current will be determined mostly by the spreading resistances in region 11A and region 11C. Further as the current goes from source to drain through layer 11, the length of the path is around 2.5 μm (depth of layer 15 is typically 1 μpm) as compared to along the surface 0.5 μm, region 14, the n-top, which will increase the on-resistance.

To overcome this problem a new device is proposed where region 11B and region 11C are made very highly conductive and region 11A is made as a very active vertical JFET with length 0.5 μm (depth in the figure of region 15 is reduced to 0.5 μm), and similar in length at the horizontal JFET at the surface.

A device fulfilling this is characterised in that a vertical JFET gate region is arranged essentially enclosed by the body region, a vertical JFET channel region being arranged between the vertical JFET gate region essentially enclosed by the body region and a dual JFET gate region, a reduced drain resistance region being arranged between said dual JFET gate region and the drain contact region, and a buried pocket being located under part of said body region, under said dual JFET gate region and under said vertical JFET channel and reduced drain resistance regions.

The invention will now be described further with the help of non-limiting embodiments shown on the enclosed drawings.

FIG. 1 shows, as mentioned above, a drawing from the prior art mentioned above, and in which region 11 has been divided into regions 11A, 11B and 11C, for explaining the difference in relation to the present invention.

Figure 2:
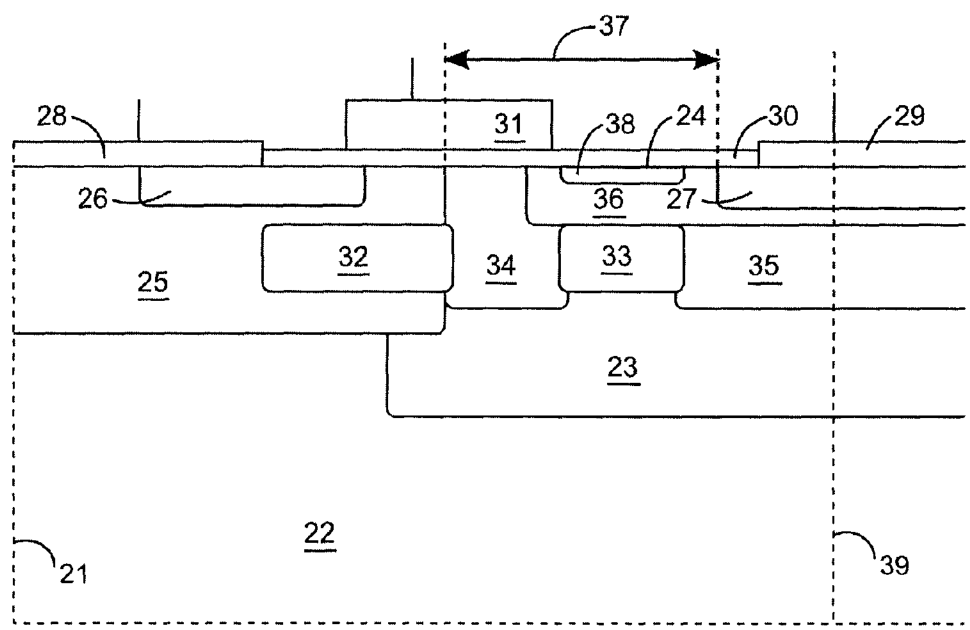

In FIG. 2 is shown a cross-sectional view of a MOS transistor according to the present invention, with an extended drain region which is a parallel combination of a lateral double-sided JFET or optionally single-sided JFET and a vertical double-sided JFET formed on a semiconductor die 21.

Figure 3:
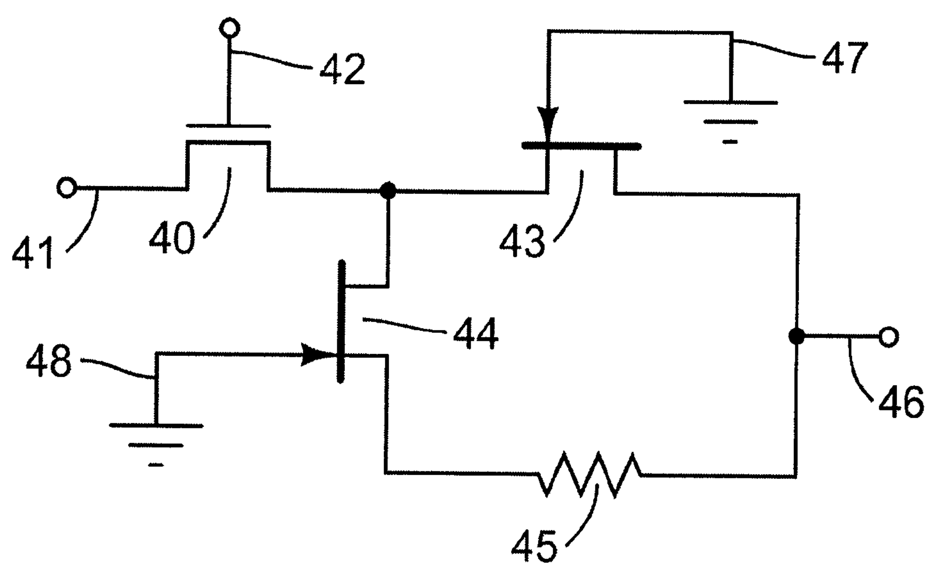

FIG. 3 shows a circuit diagram for the MOS transistor with an extended drain which is a parallel combination of a lateral double-sided JFET or optionally single-sided JFET and a vertical double-sided JFET shown in FIG. 2.

The present invention relates to a practical implementation of a semiconductor device, in which a substrate 22 of a first conductivity type is, for example, made of p-type material, doped with $1\times10^{16}$ atoms per $cm^3$. A typical depth of substrate 22 is 100 μm. A buried pocket 23 of a second conductivity type, for example n-type material, doped at $5\times10^{13}$ atoms per $cm^2$ is arranged in the substrate 22. The buried pocket 23 extends to a depth of, for example, 1 μm below a surface 24 of the die 21. The doping levels and dimensions given here and below are for a device with a breakdown voltage of approximately 10 V.

Partly touching the pocket 23 is a body region 25 of the first conductivity type, for example p-type material, doped at $1\times10^{18}$ atoms per $cm^3$. The body region 25 typically extends to a depth of 0.5 μm below the surface 24 of the die 21. A source contact region 26 of the second conductivity type, for example n-type material, doped at between $10^{19}$ and $10^{20}$ atoms per $cm^3$ is located within the body region 25. The source contact region 26 extends, for example, to a depth of 0.2 μm below the surface 24 of the die 21.

A drain contact region 27 of the second conductivity type, for example n-type material, doped at between $10^{19}$ and $10^{20}$ atoms per $cm^3$ is arranged adjoined to the surface 24 but separated from the body region 25. The drain contact region 27 extends, for example, to a depth of 0.2 μm below the surface 24 of the die 21.

A source contact 28 is placed on the surface 24 in electrical contact with the body region 25 and a source contact region portion of the source contact region 26. A drain contact 29 is placed on the surface 24 in electrical contact with the drain contact region 27. An insulating layer 30 is placed on the surface 24 of the die 21. A gate contact 31 is placed on the insulating layer 30 over a channel region portion of the body region 25.

Partly in the body region 25 a vertical JFET gate region 32 of the first conductivity type is located. Between the body region 25 and region 27 is a dual JFET gate region 33 of the first conductivity type located. The vertical JFET gate region 32 and the dual JFET gate region 33 is, for example, p-type material both doped at $1\times10^{13}$ atoms per $cm^2$. The vertical JFET gate region 32 and the dual JFET gate region 33 extend downwards from the surface 24 to a depth of, for example, 0.5 μm. The dual JFET gate region 33 is connected to ground at the surface 24 in a plane not shown in FIG. 2.

Between vertical JFET gate region 32 and the dual JFET gate region 33 is a vertical JFET channel region 34 of the second conductivity type located. Between the dual JFET gate region 33 and the drain contact region 27 is a reduced drain resistance region 35 of the second conductivity type located. The vertical JFET channel region 34 and the reduced drain resistance region 35 is, for example, n-type material both doped at $1\times10^{17}$ atoms per $cm^3$. The vertical JFET channel region 34 and reduced drain resistance region 35 extend downwards from the surface 24 to a depth of, for example, 0.5 μm.

Above the dual JFET gate region 33 is a lateral JFET channel region 36 of the second conductivity type located.

The lateral JFET channel region 36 is, for example, n-type material doped at $6\times10^{12}$ atoms per $cm^2$. The lateral JFET channel region 36 extends downwards from the surface 24 to a depth of, for example, 0.2 μm. A distance 37 between an edge of the body region 25 and an edge of the drain contact region 27 is, for example 1 μm. A symmetry line 39 is used for placing a second half of the transistor in a mirror image to the first half shown in FIG. 2.

Above the dual JFET gate region 33 and the lateral JFET channel region 36 is a lateral JFET gate region 38 of the first conductivity type located. The lateral JFET gate region 38 is, for example, p-type material doped at $3\times10^{12}$ atoms per $cm^2$. The lateral JFET gate region 38 extends downwards from the surface 24 to a depth of, for example, 0.05 μm. The lateral JFET gate region 38 is electrically connected to ground with a contact at the surface 24 or in a plane not shown in FIG. 2. The lateral JFET gate region 38 and the dual JFET gate region 33 may also be grounded in the plane shown by extending the body region 25 to make contact with JFET gate regions 33 and 38, in given intervals regularly spaced from each other. The lateral JFET gate region 38 is optional and if it is removed the lateral JFET channel region 36 is, for example, doped at $3\times10^{12}$ atoms per $cm^2$.

The device shown in FIG. 2 may also function as a bipolar transistor with the source contact region 26 functioning as an emitter, the body region 25 functioning as a base and the vertical JFET channel region 34, the lateral JFET channel region 36, the buried pocket 23, the reduced drain resistance region 35 and drain contact region 27 functioning as an extended collector.

FIG. 3 shows a circuit diagram for a MOS transistor with an extended drain which is a parallel combination of a lateral double-sided JFET or optionally single-sided JFET and a vertical double-sided JFET shown in FIG. 2. The MOS transistor 40 is controlled by a gate contact 42. Current through the MOS transistor 42 travels from a source contact 41 through the MOS transistor 40, through the extended drain region to the drain contact 46. The extended drain region includes a parallel combination of a lateral double-sided JFET 43 and a vertical double-sided JFET 44 in series with a resistor 45. The gate of the lateral double-sided JFET 43 is connected to ground 47 and the gate of the vertical double-sided JFET 44 is connected to ground 48.

The source contact 41 and the gate contact 42 of the MOS transistor 40 corresponds to the source contact region 26 and the gate contact 31 in FIG. 2. The channel of the lateral double-sided JFET 43 corresponds to the lateral JFET channel region 36 in FIG. 2. The grounded gate 47 of the lateral double-sided JFET 43 corresponds to the dual JFET gate region 33 and the lateral JFET gate region 38. The channel of the vertical double-sided JFET 44 corresponds to the vertical JFET channel region 34 in FIG. 2. The grounded gate 48 of the vertical double-sided JFET 44 corresponds to the dual JFET gate region 33 and the vertical JFET gate region 32. The resistor 45 corresponds to the buried pocket 23 and the reduced drain resistance region 35 in FIG. 2.

A power device implemented in a 65 nm CMOS technology with gate oxide thickness of 5 nm and channel length around 0.2 μm according to the preferred embodiment will achieve an on-resistance of around 1 ohmmm and maximum drain current above 1 A/mm which is at least 2-3 times better than presently shown and should meet the performance specification for e.g. an integrated WLAN solution in the frequency range of 2-5 GHz. [E.g. A. Mai, H. Rucker, R. Sorge, D. Schmidt and C. Wipf, "Cost-Effective Integration of RF-LDMOS Transistors in 0.13 μm CMOS Technology", IEEE Topical Meeting on Silicon Monolithic Integrated Circuits in RF Systems (SiRF '09), pp. 1-4, 2009.]

The invention claimed is:

1. A semiconductor device comprising:

a substrate (22) of a first conductivity type, a body region (25) of semiconductor material of the first conductivity type which adjoins the surface (24) of the substrate (22), a source contact region (26) of semiconductor material of the second conductivity type, the source contact region (26) being within the body region (25) and adjoining the surface of the substrate (22), a drain contact region (27) of semiconductor material of the second conductivity type which adjoins the surface (24) of the substrate (22) and being separated from the body region (25), a dual JFET gate region (33) of semiconductor material of the first conductivity type located between the body region (25) and the drain contact region (27), a lateral JFET channel region (36) of semiconductor material of the second conductivity type which adjoins the surface (24) of the substrate (22) and which is located between the body region (25) and the drain contact region (27), wherein at least a portion of the lateral JFET channel region (36) extends between the dual JFET gate region (33) and the surface (24) of the substrate (22), characterised in that a vertical JFET gate region (32) of semiconductor material of the first conductivity type is arranged essentially enclosed by the body region (25), a vertical JFET channel region (34) of semiconductor material of the second conductivity type is arranged between the vertical JFET gate region (32) essentially enclosed by the body region (25) and said dual JFET gate region (33), a reduced drain resistance region (35) of semiconductor material of the second conductivity type is arranged between said dual JFET gate region (33) and the drain contact region (27), and a buried pocket (23) of semiconductor material of a second conductivity type which is located under part of said body region (25), under said dual JFET gate region (33) and under said vertical JFET channel and reduced drain resistance regions (34, 35).

2. Semiconductor device according to claim 1, wherein said vertical JFET channel and reduced drain resistance regions (34, 35) are arranged to adjoin the surface (24) of the substrate (22).

3. Semiconductor device according to claim 1, wherein said vertical JFET channel and reduced drain resistance regions (34, 35) are arranged isolated from the surface (24) of the substrate (22).

4. Semiconductor device according to claim 1, wherein said vertical JFET channel and reduced drain resistance regions (34, 32) extend downwards from the surface (24) of the substrate (22) to at least the same depth as the depth of said dual JFET gate region (33).

5. Semiconductor device according to claim 4, wherein said vertical JFET channel and reduced drain resistance regions (34, 35) extend downwards from the surface (24) to a depth of at least 0.5 μm.

6. Semiconductor device according to claim 1, wherein said dual JFET gate region (33) adjoins the surface (24) of the substrate (22).

7. Semiconductor device according to claim 1, wherein a lateral JFET gate region (38) of semiconductor material of the first conductivity type is located above said lateral JFET channel region (36) and said dual JFET gate region (33).

8. Semiconductor device according to claim 1, wherein said semiconductor device is an insulated gate field effect transistor with an extended drain region.

* * * * *